US010741451B2

(12) United States Patent
Zang et al.

(10) Patent No.: US 10,741,451 B2
(45) Date of Patent: Aug. 11, 2020

(54) FINFET HAVING INSULATING LAYERS BETWEEN GATE AND SOURCE/DRAIN CONTACTS

(71) Applicant: GLOBALFOUNDRIES INC., Grand Cayman (KY)

(72) Inventors: Hui Zang, Guilderland, NY (US); Laertis Economikos, Wappingers Falls, NY (US); Shesh Mani Pandey, Saratoga Springs, NY (US); Chanro Park, Clifton Park, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 4 days.

(21) Appl. No.: 16/150,651

(22) Filed: Oct. 3, 2018

(65) Prior Publication Data

US 2020/0111713 A1   Apr. 9, 2020

(51) Int. Cl.
*H01L 21/8234* (2006.01)
*H01L 27/088* (2006.01)
*H01L 21/762* (2006.01)
*H01L 29/417* (2006.01)
*H01L 29/66* (2006.01)
*H01L 29/78* (2006.01)
*H01L 29/49* (2006.01)

(52) U.S. Cl.
CPC ............. *H01L 21/823431* (2013.01); *H01L 21/76224* (2013.01); *H01L 21/823468* (2013.01); *H01L 27/0886* (2013.01); *H01L 29/41791* (2013.01); *H01L 29/4925* (2013.01); *H01L 29/4958* (2013.01); *H01L 29/6656* (2013.01); *H01L 29/66795* (2013.01); *H01L 29/785* (2013.01); *H01L 29/7856* (2013.01); *H01L 2029/7858* (2013.01)

(58) Field of Classification Search
CPC ....... H01L 21/823431; H01L 29/66795; H01L 27/0886; H01L 29/41791; H01L 29/785; H01L 29/4958; H01L 29/4925; H01L 29/7856; H01L 29/6656
See application file for complete search history.

(56) References Cited

U.S. PATENT DOCUMENTS

| 5,939,749 A | 8/1999 | Taketa et al. |
| 8,981,496 B2 | 3/2015 | Liu et al. |
| 9,209,302 B2 | 12/2015 | Tsai et al. |

(Continued)

*Primary Examiner* — Selim U Ahmed
*Assistant Examiner* — Evan G Clinton
(74) *Attorney, Agent, or Firm* — Gibb & Riley, LLC; Francois Pagette

(57) ABSTRACT

Processes form integrated circuit apparatuses that include parallel fins, wherein the fins are patterned in a first direction. Parallel gate structures intersect the fins in a second direction perpendicular to the first direction, wherein the gate structures have a lower portion adjacent to the fins and an upper portion distal to the fins. Source/drain structures are positioned on the fins between the gate structures. Source/drain contacts are positioned on the source/drain structures and multiple insulator layers are positioned between the gate structures and the source/drain contacts. Additional upper sidewall spacers are positioned between the upper portion of the gate structures and the multiple insulator layers.

20 Claims, 14 Drawing Sheets

(56) References Cited

U.S. PATENT DOCUMENTS

| | | |
|---|---|---|
| 9,269,792 B2 | 2/2016 | Cheng et al. |
| 9,768,272 B2 | 9/2017 | Hashemi et al. |
| 2005/0020086 A1 | 1/2005 | Kim et al. |
| 2005/0087776 A1 | 4/2005 | Kim |
| 2007/0096185 A1 | 5/2007 | Kim et al. |
| 2011/0095378 A1 | 4/2011 | Lee et al. |
| 2018/0047754 A1* | 2/2018 | Basker .............. H01L 21/82343 |
| 2018/0248012 A1* | 8/2018 | Morrow .............. H01L 23/5226 |

* cited by examiner

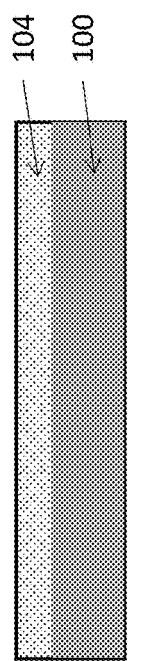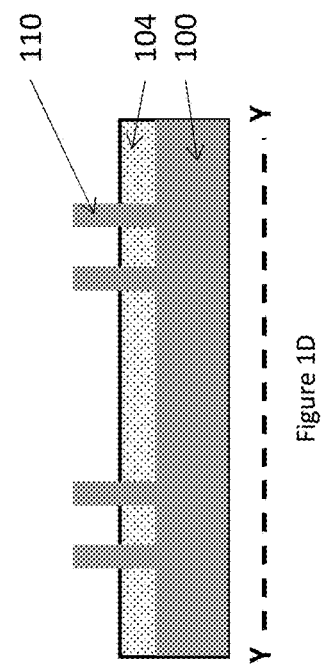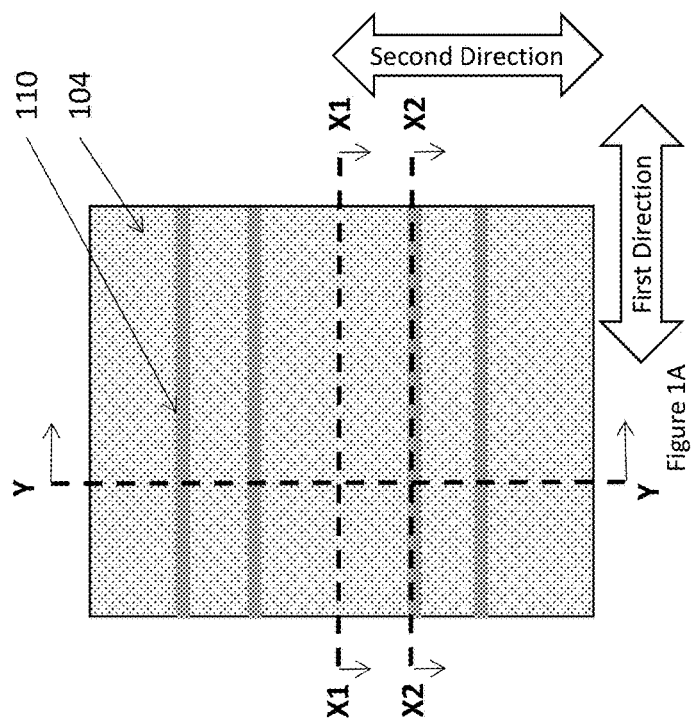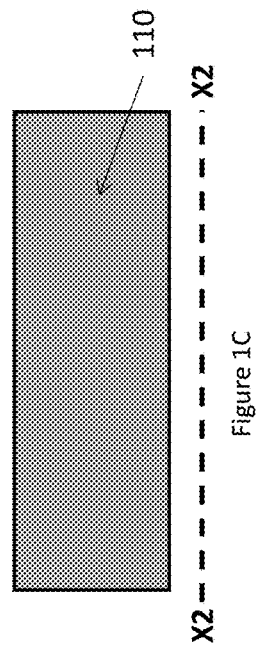

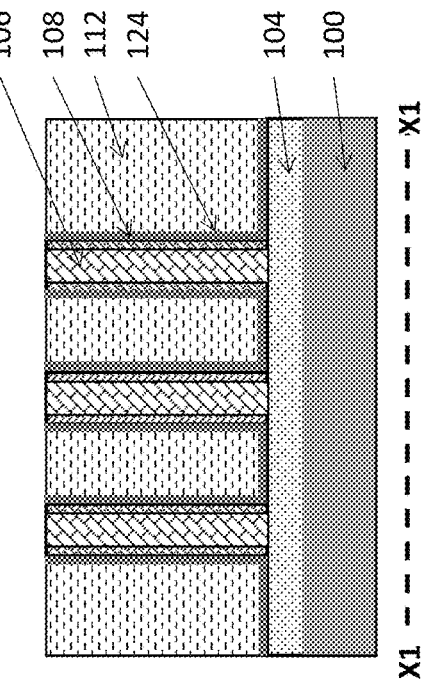
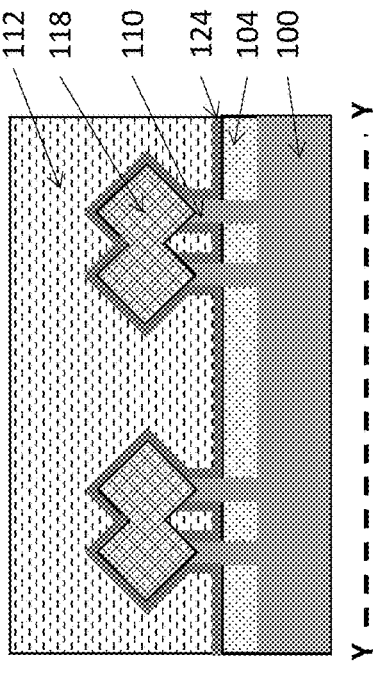
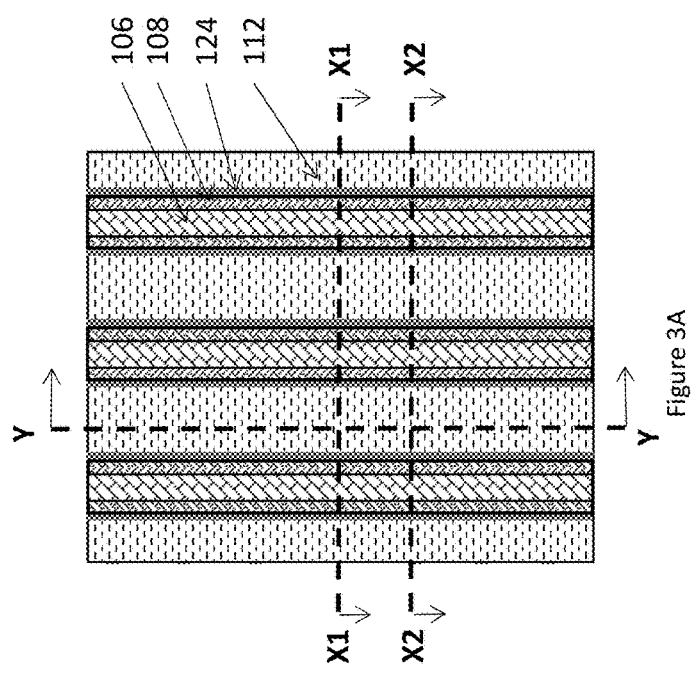
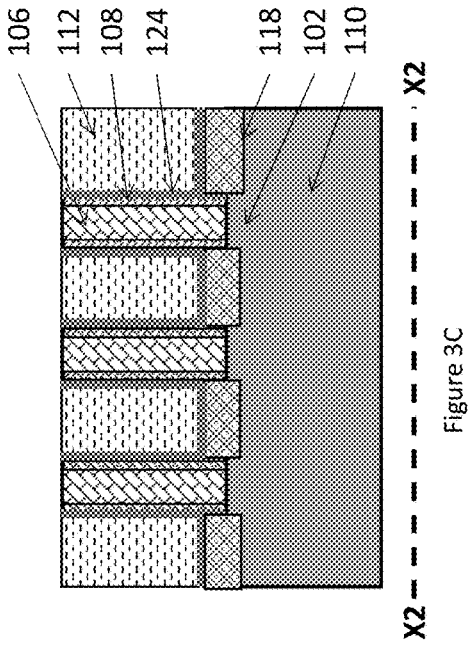
Figure 3A
Figure 3B
Figure 3C
Figure 3D

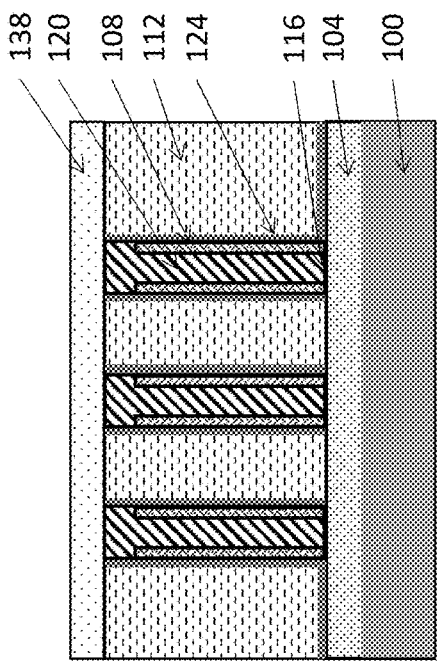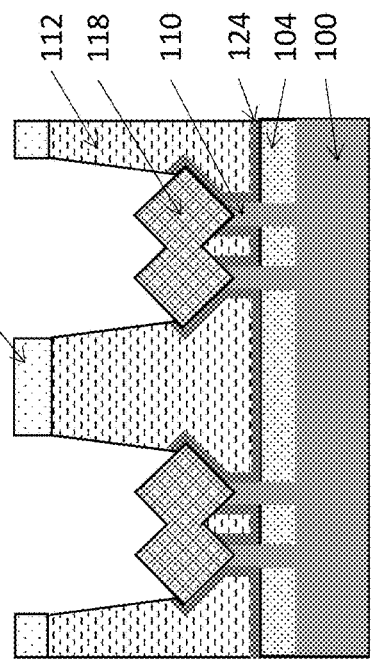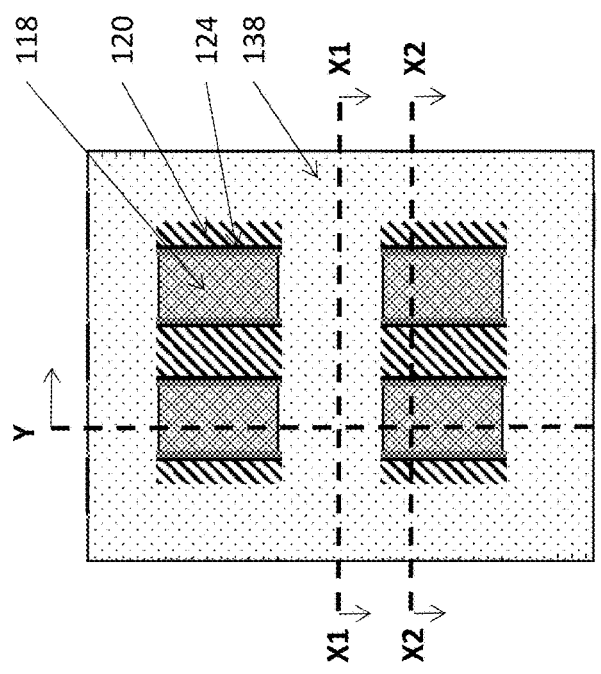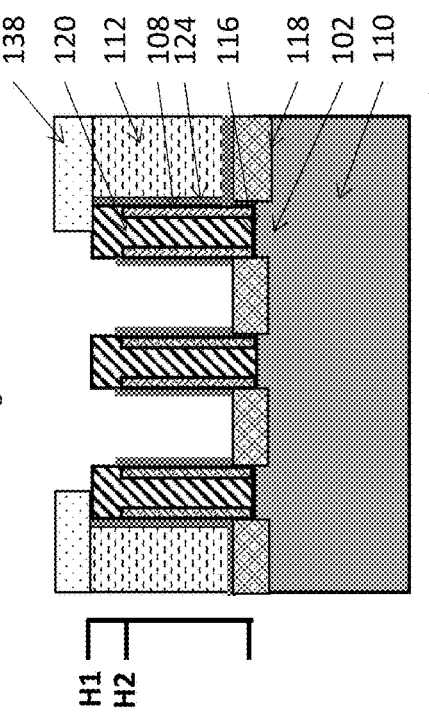
Figure 6A
Figure 6B
Figure 6C
Figure 6D

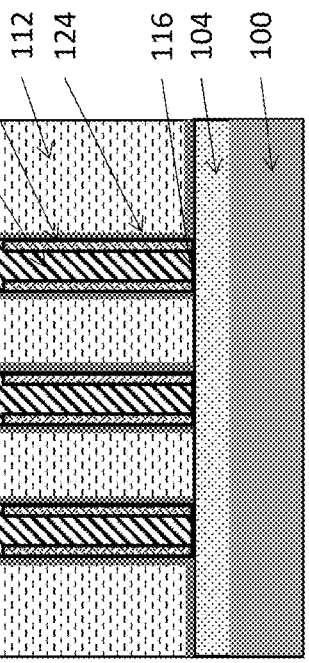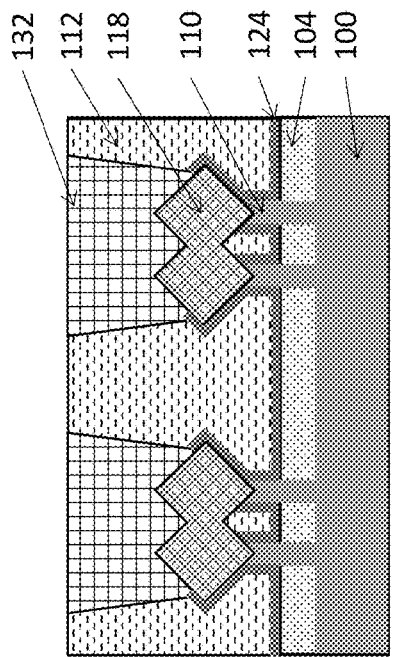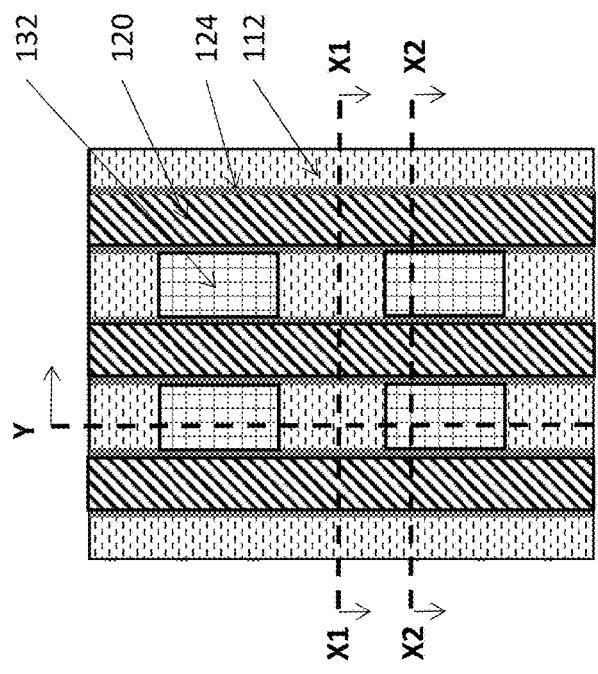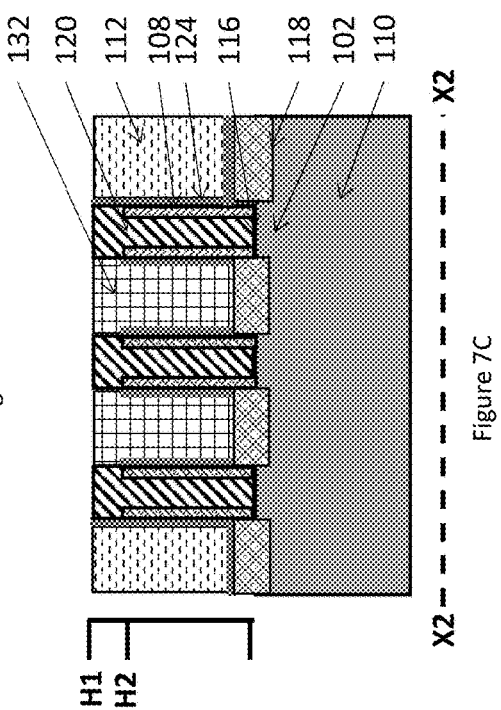

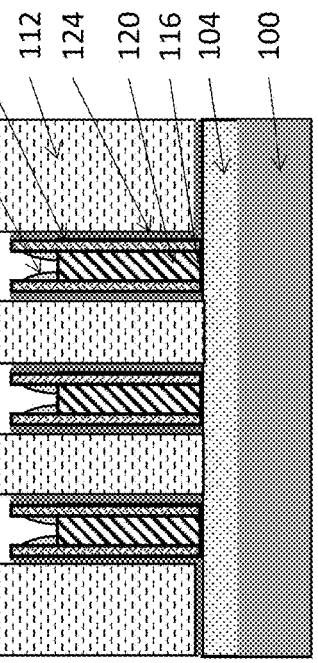
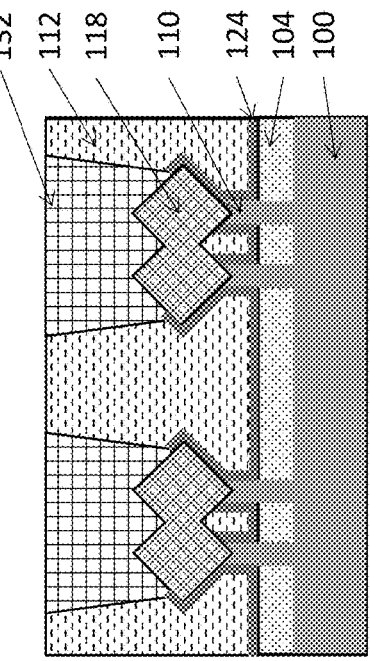
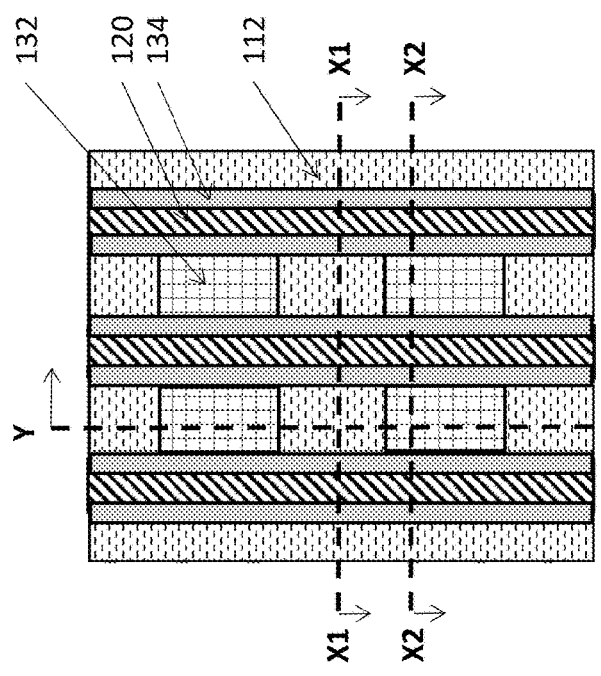
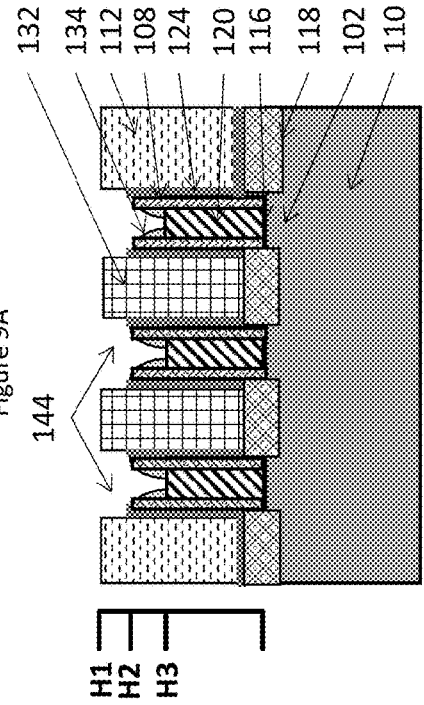

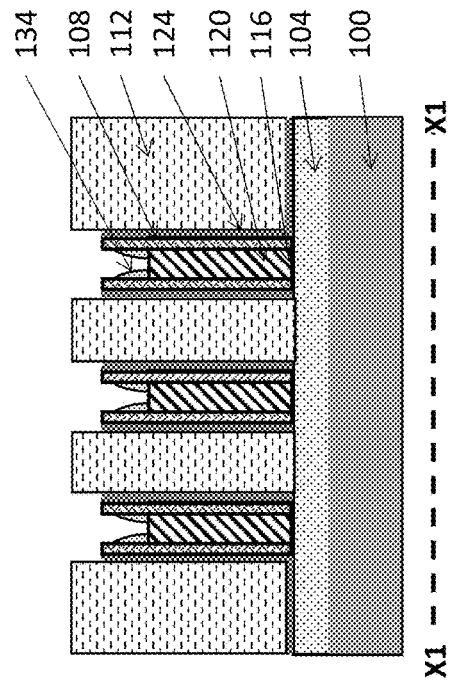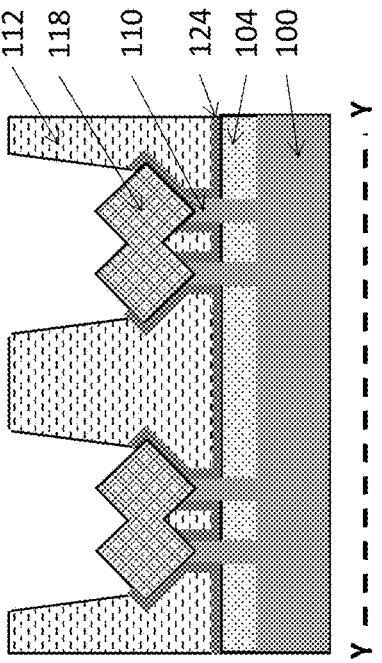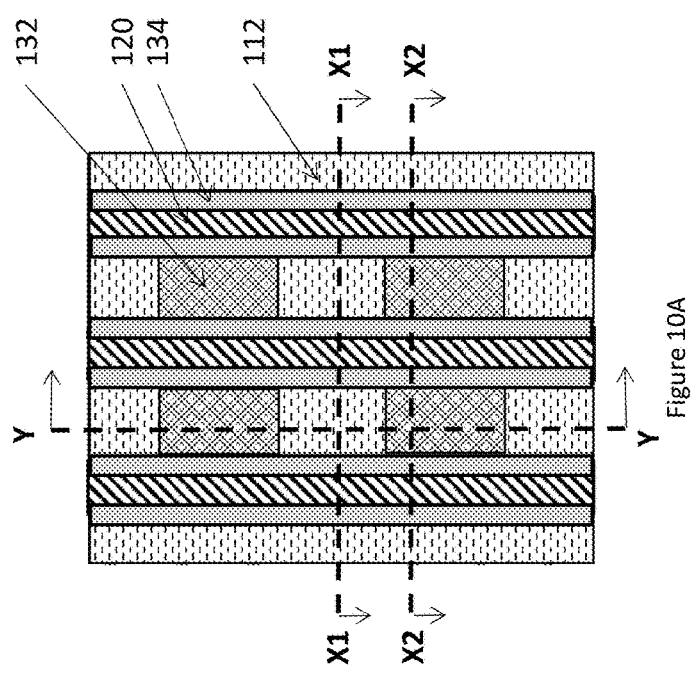

FINFET HAVING INSULATING LAYERS BETWEEN GATE AND SOURCE/DRAIN CONTACTS

BACKGROUND

Field of the Invention

The present disclosure relates to integrated circuit devices, and to processing for making such devices, and more specifically to processing that avoids many conventional processing steps and accommodates contact misalignment by providing additional insulating layers between gate and source/drain contacts.

Description of Related Art

Integrated circuit devices use transistors for many different functions, and these transistors can take many different forms, from planar transistors, to transistors that use a "fin" style structure (e.g., fin-type field effect (FinFET) transistors). A fin of a fin-type transistor is a thin, long, six-sided shape (that is somewhat rectangular) that extends from, or has a bottom surface that is part of, a substrate; with sides that are longer than they are wide, a top and bottom that have somewhat similar lengths as the sides (but that have widths that are much narrower) and ends that are approximately as tall from the substrate as the width of the sides, but that are only approximately as wide as the top and/or bottom. Rounding and uneven shaping can occur (especially at the corners and top) in such fin structures, and often such structures have a rounded, tapered shape; however, such structures are highly distinguishable from planar devices (even though both types of devices are highly useful).

In one example, conventional processing forms source/drains on fins between intersecting gates. Often work function metals are used as portions of the gates and such work function metals can need to be chamfered. Chamfering, with respect to work function metals in FinFETs, is a process of depositing a protective fill material onto a work function metal layer, recessing the protective fill material, etching away any exposed work function metal material extending above the protective fill material, and later removing the protective fill material; however, such multi-step processing is time, material, and machine intensive; and introduces additional opportunities for defect formation. Further, other metallizations (such as tungsten) are used in gates in addition to work function metals, and such materials often are recessed in additional processing, which again can be time, material, and machine intensive; and can introduce defects. Additional steps, that are included when performing self-aligned contact (SAC) processing, are employed to align contacts with gates and other FinFET elements; however, again such SAC processing can be time, material, and machine intensive.

SUMMARY

Exemplary methods herein pattern a layer to form parallel fins extending from the layer, where the fins are patterned in a first direction. These methods also pattern parallel sacrificial gates intersecting the fins in a second direction perpendicular to the first direction, form a first sidewall insulator on sidewalls of the sacrificial gates, epitaxially grow source/drain structures on the fins between the sacrificial gates, form a second sidewall insulator on the first sidewall insulator, and form a lower insulator layer contacting the second sidewall insulator between the sacrificial gate. In some implementations, the first sidewall insulator and the second sidewall insulator can have different dielectric constants.

Such methods reduce the height of the sacrificial gates and the first sidewall insulator (from a first height from the fin to a reduced height from the fin) in processing that leaves the lower insulator layer and the second sidewall insulator unaltered and at the first height. Also, these methods replace the sacrificial gates with a first conductor to form a lower portion of gate structures, in processing that forms the lower portion of gate structures to the first height and to cover the reduced height first sidewall insulator. Additionally, these methods remove portions of the lower insulator layer and corresponding horizontal portions of the second sidewall insulator (e.g., anisotropic etching) while the lower portion of the gate structures cover the first sidewall insulator, in processing that exposes ones of the source/drain structures (but such processing avoids removing the second sidewall insulators from the first sidewall insulator or the lower portion of the gate structures). Such methods form sacrificial source/drain contact structures (to the first height) on exposed ones of the source/drain structures between the lower portion of the gate structures. Additionally, these methods reduce the height of the lower portion of the gate structures (to a third height from the fin, that is less than the "reduced" height) to form first recesses.

These methods also form upper sidewall spacers in the first recesses in processing that causes the upper sidewall spacers to contact sidewalls of the sacrificial source/drain contact structures, the lower portion of the gate structures, the first sidewall insulator, and the second sidewall insulator. The upper sidewall spacers partially fill the first recess, and the upper sidewall spacers extend only the depth of the first recesses. The upper sidewall spacers can be a different insulator material from the first sidewall insulator and the second sidewall insulator. Methods herein remove the sacrificial source/drain contact structures to leave second recesses and form a second conductor in the first recesses between the upper sidewall spacers and in the second recesses to simultaneously form an upper portion of the gate structures and lower source/drain contact structures.

Various exemplary integrated circuit apparatuses herein include (among other components) parallel fins extending from a lower layer that are patterned in a first direction, and parallel gate structures intersecting the fins in a second direction perpendicular to the first direction. The gate structures have a lower portion that includes a first conductor adjacent to the fins, and an upper portion that includes a second conductor distal to the fins. The lower portion of the gate structures can have irregular heights from the fin. Also, the lower portion of gate structures is wider, in the first direction, than the upper portion of the gate structures. The first conductor and the second conductor can be different from one another, and can be made up of many different materials, such as conductors with different work functions; however, the upper portions of the gate structures and the lower source/drain contacts can be the same material.

Additionally, a gate insulator is between the lower portion of the gate structures and the fins, and epitaxial source/drain structures are positioned on the fins between the gate structures. Further, lower source/drain contacts are on the source/drain structures. Such lower source/drain contacts are also positioned between the gate structures.

Multiple insulator layers are positioned between the gate structures and the lower source/drain contacts, adjacent to the upper portion and the lower portion of the gate structures. The multiple insulator layers can be made of two different insulator layers having different dielectric constants. Additional upper sidewall spacers are positioned between the upper portion of the gate structures and the multiple insulator layers. The upper sidewall spacers are only adjacent to the upper portion of the gate structures and are not adjacent to the lower portion of the gate structures. The upper sidewall spacers can be a different insulator material from the multiple insulator layers.

Also, an inter-layer dielectric is positioned on the lower source/drain contacts and the upper portion of the gate structures. Gate contacts extend through the inter-layer dielectric and contact the upper portion of the gate structures. Further, upper source/drain contacts extend through the inter-layer dielectric and contact the lower source/drain contacts.

BRIEF DESCRIPTION OF THE DRAWINGS

The embodiments herein will be better understood from the following detailed description with reference to the drawings, which are not necessarily drawn to scale and in which:

FIG. 1A is a top (plan) view conceptual schematic diagram of an integrated circuit structure according to embodiments herein;

FIG. 1B is a cross-sectional view conceptual schematic diagram along line X1-X1 in FIG. 1A of an integrated circuit structure according to embodiments herein;

FIG. 1C is a cross-sectional view conceptual schematic diagram along line X2-X2 in FIG. 1A of an integrated circuit structure according to embodiments herein;

FIG. 1D is a cross-sectional view conceptual schematic diagram along line Y-Y in FIG. 1A of an integrated circuit structure according to embodiments herein;

FIGS. 3A-3D are conceptual schematic diagrams of manufacturing stages of integrated circuit structures corresponding the views shown in FIG. 1A-1D, respectively;

FIGS. 6A-6D are conceptual schematic diagrams of manufacturing stages of integrated circuit structures corresponding the views shown in FIG. 1A-1D, respectively;

FIGS. 7A-7D are conceptual schematic diagrams of manufacturing stages of integrated circuit structures corresponding the views shown in FIG. 1A-1D, respectively;

FIGS. 9A-9D are conceptual schematic diagrams of manufacturing stages of integrated circuit structures corresponding the views shown in FIG. 1A-1D, respectively;

FIGS. 10A-10D are conceptual schematic diagrams of manufacturing stages of integrated circuit structures corresponding the views shown in FIG. 1A-1D, respectively;

DETAILED DESCRIPTION

Figure 2A:
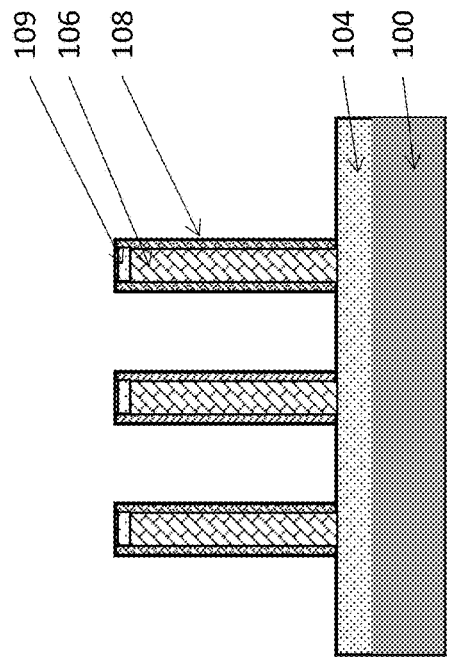
FIGS. 2A-2D are conceptual schematic diagrams of manufacturing stages of integrated circuit structures corresponding the views shown in FIG. 1A-1D, respectively.
Figure 2B:
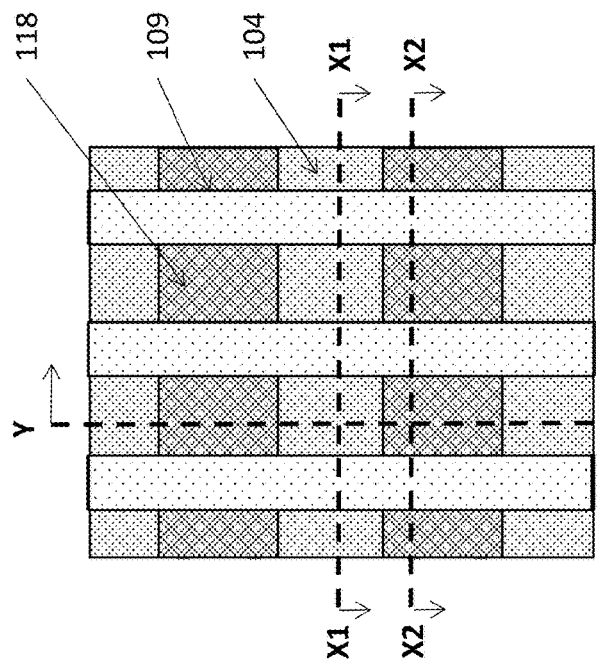
Figure 2C:
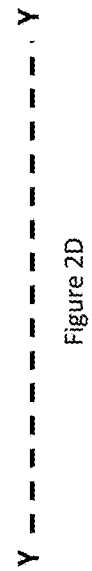
Figure 2D:
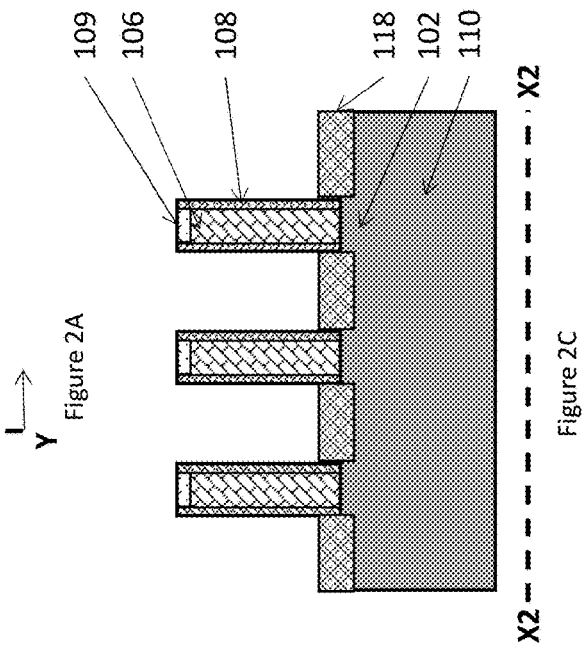
Figure 4B:
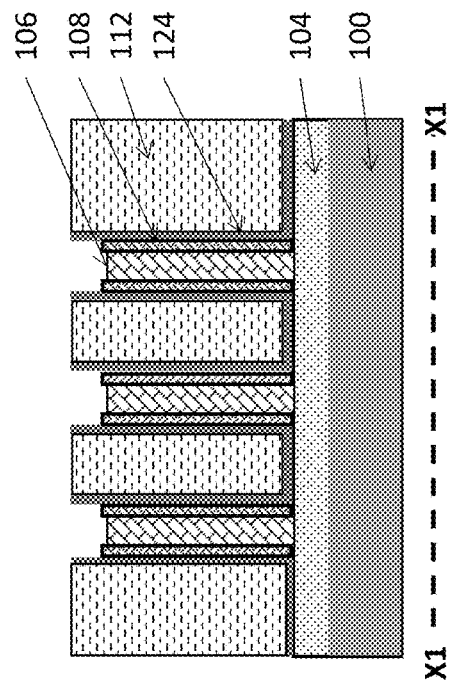
FIGS. 4A-4D are conceptual schematic diagrams of manufacturing stages of integrated circuit structures corresponding the views shown in FIG. 1A-1D, respectively.
Figure 4D:
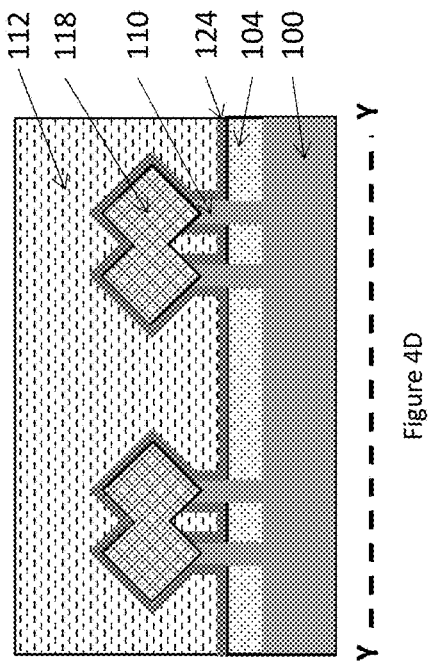
Figure 4A:
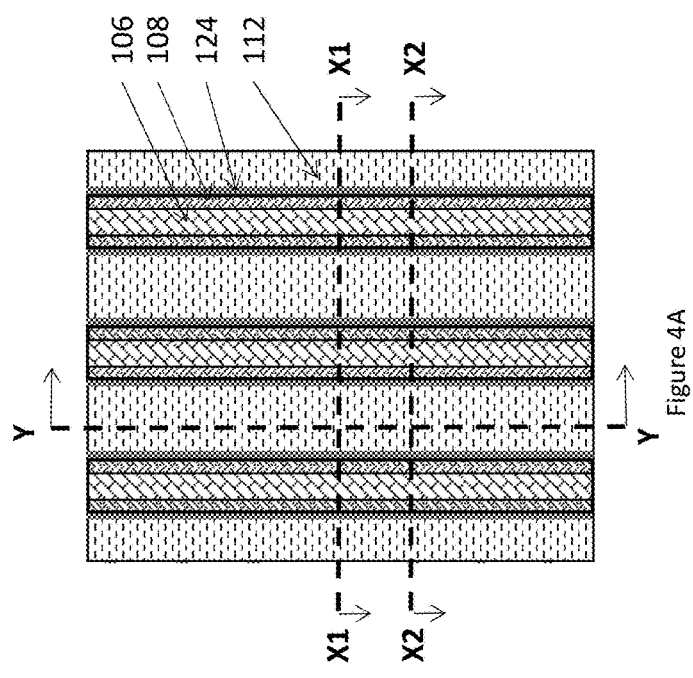
Figure 4C:
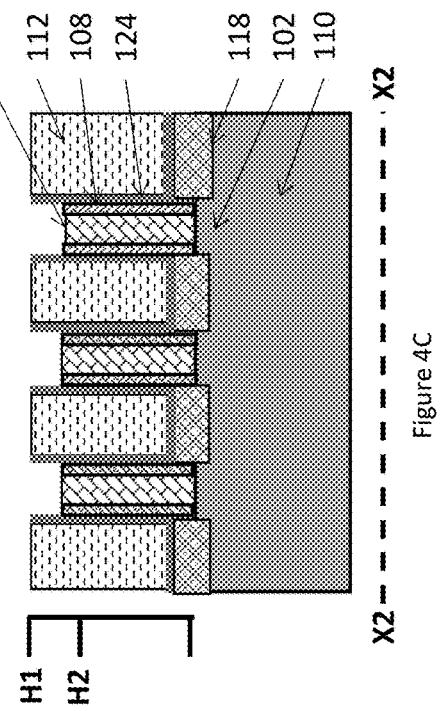

As noted above, chamfering, is a multi-step process that can be time, material, and machine intensive; and can introduce additional opportunities for defect formation. Further, other metallization (such as tungsten) are used in gates in addition to work function metals, and such materials often are recessed in additional processing, which again can be time, material, and machine intensive; and can introduce defects.

Additional steps, that are included when performing self-aligned contact (SAC) processing, are employed to align contacts with gates and other FinFET elements. For example, it is common to form cap layers on gate conductors and perform chemical mechanical polishing (CMP) on such cap layers. However, again such SAC processing can be time, material, and machine intensive.

The processing described herein uses strategically placed and sized sidewall insulators and spacers to avoid chamfering work function metals and gate metal recessing. Further, such sidewall insulators and spacers accommodate contact misalignment by providing additional spacing between gate contacts and source/drain contacts, reducing the amount of SAC processing.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures can, in one example, be formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. Isolation structures are generally formed using highly insulating material (this allows different active areas of the substrate to be electrically isolated from one another). Also, a hardmask can be formed of any suitable material, whether now known or developed in the future, such as a nitride, metal, or organic hardmask, that has a hardness greater than the substrate and insulator materials used in the remainder of the structure.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed (grown or deposited) from any of the many candidate low dielectric constant materials (low-K (where K corresponds to the dielectric constant of silicon dioxide) materials such as fluorine or carbon-doped silicon dioxide, porous silicon dioxide, porous carbon-doped silicon dioxide, spin-on silicon or organic polymeric dielectrics, etc.) or high dielectric constant (high-K) materials, including but not limited to silicon nitride, silicon oxynitride, a gate dielectric stack of $SiO_2$ and $Si_3N_4$, hafnium oxide ($HfO_2$), hafnium zirconium oxide ($HfZrO_2$), zirconium dioxide ($ZrO_2$), hafnium silicon oxynitride (HfSiON), hafnium aluminum oxide compounds ($HfAlO_x$), other metal oxides like tantalum oxide, etc. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, polysilicon-germanium, rendered conductive by the presence of a suitable dopant, etc. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art. Further, some conductors herein can be partially or fully formed of a metal having a specific work function. The work function of the conductor can be selected to use a specific amount of energy to remove an electron from the solid material, and thereby enhance transistor performance.

FIGS. 1A-13 use an example that shows field effect transistors (FETs), and more specifically fin-type FETs (FinFETs). While only one type or a limited number of transistor types are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

FIGS. 1A-1D illustrate one example of a partially formed FinFET structure. More specifically, FIG. 1A is a top (plan) view conceptual schematic diagram of an integrated circuit structure according to embodiments herein, FIG. 1B is a cross-sectional view conceptual schematic diagram of the same along line X1-X1 in FIG. 1A, FIG. 1C is a cross-sectional view conceptual schematic diagram along line X2-X2 in FIG. 1A, and FIG. 1D is a cross-sectional view conceptual schematic diagram along line Y-Y in FIG. 1A.

To form the structures shown in FIGS. 1A-1D, different processing can be used. In some exemplary methods, a bottom layer 100 (of in situ formed, or later doped, semiconductor material) is patterned into fins 110 as shown in FIG. 1D. As shown in FIG. 1C, this forms a "first" layer or substrate structure (e.g., fins 110). Note that while the first layer can be a fin structure, it does not need to be, and the first layer can, in some implementations, simply be a planar layer. Therefore, the fins 110 are sometimes generically referred to herein simply as a layer or substrate. As can be seen in FIG. 1D, an insulator or isolation material 104 (e.g., shallow trench isolation STI) can be formed and reduced in height to reveal the fins 110.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

FIGS. 2A-2D show the same views as FIGS. 1A-1D mentioned above. As shown in FIGS. 2A-2D, such processing forms sacrificial gates 106 (which are commonly referred to as "dummy" gates) extending over the channel regions 102 of the fin layer 110 (e.g., see FIG. 2C) using mask 109; the sacrificial gates 106 can be, in one example, polysilicon. Also, first sidewall insulators 108 or first sidewall spacers (which can be, for example, a low-k material) are formed on the sacrificial gates 106. Such methods form source/drain structures 118 (using, for example, epitaxial growth or implantation processes) in and/or on the fin layer 110 on opposite sides of the sacrificial gates 106. The source/drain structures 118 are self-aligned in the epitaxial growth process by the first sidewall insulators 108.

For purposes herein, "sidewall spacers" are structures are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

FIGS. 3A-3D show the same relative views as FIGS. 1A-1D mentioned above. As shown in FIGS. 3A-3D, such processing forms a second sidewall insulator 124 on the first sidewall insulator 108 (e.g., second sidewall spacers). Such a second sidewall insulator 124 can be a conformal insulator layer (e.g., which can be, in one example, a contact etch stop layer (CESL) such as a nitride, etc.) and therefore the second sidewall insulator 124 initially also forms as a thin layer on the source/drain regions and on the isolation material 104 (which is removed in later processing described below). Note that the first sidewall insulator 108 and the second sidewall insulator 124 can be different materials which can have different dielectric constants.

After the second sidewall insulator 124 has been formed, these processes form a lower insulator layer 112 (e.g., an oxide, such as silicon dioxide). The lower insulator layer 112 can therefore contact the second sidewall insulator 124, and be located between the sacrificial gates 106. All elements can be planarized to the same height as shown in FIGS. 3A-3D, using for example CMP.

FIGS. 4A-4D show the same views as FIGS. 1A-1D mentioned above. In FIGS. 4A-4D, these methods reduce the height of the sacrificial gates 106 and the first sidewall insulator 108 from a first height (H1) from the top of the layer 110 to a reduced height (H2) from the top of the layer 110, in processing that leaves the lower insulator layer 112 and the second sidewall insulator 124 at the first height (H1). In one example, a selective reactive ion etching (RIE) process that only attacks the sacrificial gates 106 (e.g., only attacks polysilicon) can be performed first, followed by RIE processing that only removes the first sidewall insulator 108 (e.g., only attacks silicon dioxide).

Selective material removal processes first form elements from materials that can be selectively removed relative to one another; and then later apply removal techniques that remove one material, while leaving the other material(s) substantially unaffected. While some material selections and selective removal techniques are mentioned herein, those ordinarily skilled in the art would understand that different materials could be utilized, so long as such materials are selectively removable from one another. Note that while some selective material removal processes may partially remove (or produce rounding of) adjacent materials, such may not be fully shown in the drawings, to simplify the drawings and thereby more clearly illustrate the concepts herein.

FIGS. 5A-5D show the same views as FIGS. 1A-1D mentioned above. As shown in FIGS. 5A-5D, the methods herein remove the sacrificial gates 106 (but leave the first and second sidewall insulators 108, 124 and insulator 112 in place). Again, selective material removal processing that only attacks the material of the sacrificial gates 106 (e.g., only attacks polysilicon) can be used to remove the sacrificial gates 106. A gate insulator 116 (e.g., gate oxide) can be deposited or grown on (directly contacting) the channel region 102 of the fin layer 110.

One or more conductors (e.g., layers of different work function conductors, all of which are collectively illustrated in the drawings by element 120) are deposited to fill in the space between the first and second sidewall insulators 108, 124 where the sacrificial gates 106 were previously located.

Also, element 120 can represent different work function metals, such as p-type and n-type work function metals used in p-type and n-type transistors. Therefore, as shown in FIGS. 5A-5D, this processing replaces the sacrificial gates 106 with a first conductor to form what is referred to herein as a lower portion of gate structures, in processing that initially forms the lower portion 120 of gate structures (e.g., a high-k/metal gate (HKMG) to the first height (H1) and to fully cover the sides and top of the reduced height (H2) first sidewall insulator. Excess HKMG material can be removed after such processing.

Figure 5A:
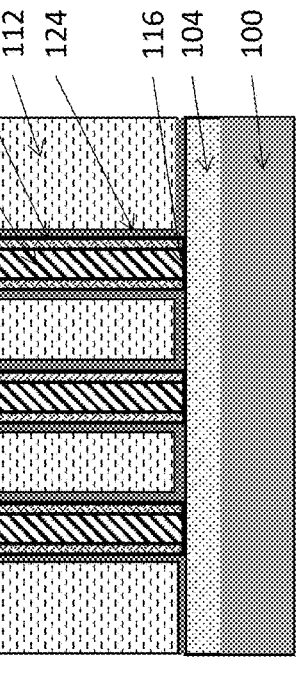
FIGS. 5A-5D are conceptual schematic diagrams of manufacturing stages of integrated circuit structures corresponding the views shown in FIG. 1A-1D, respectively.
Figure 5B:
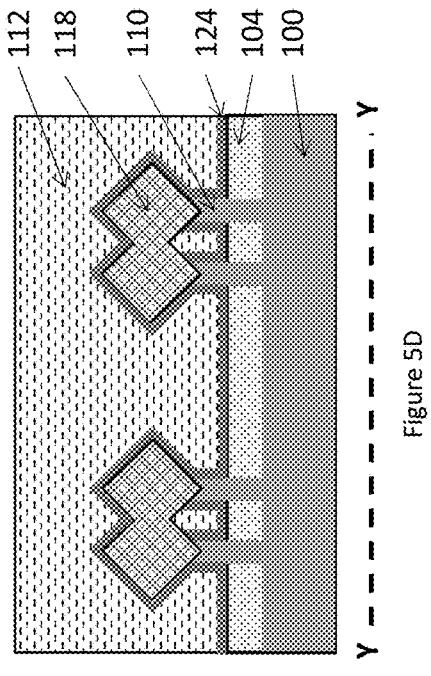
Figure 5C:
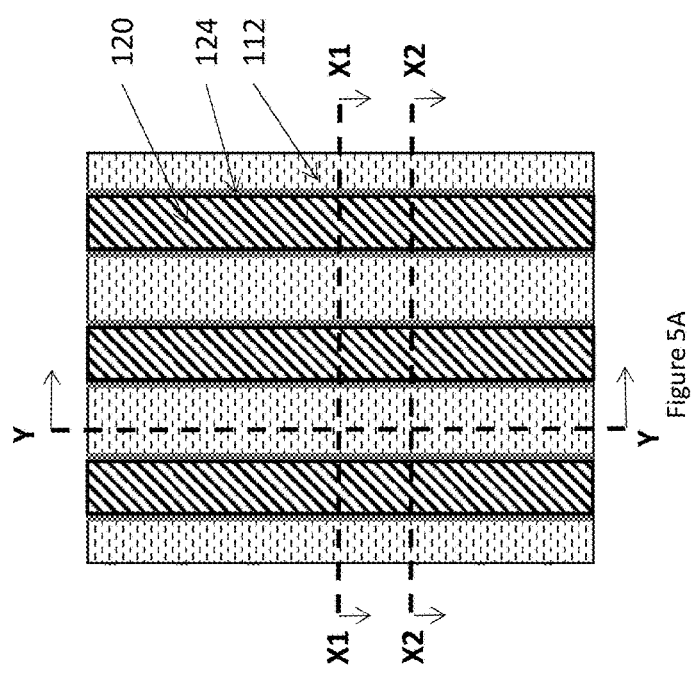
Figure 5D:
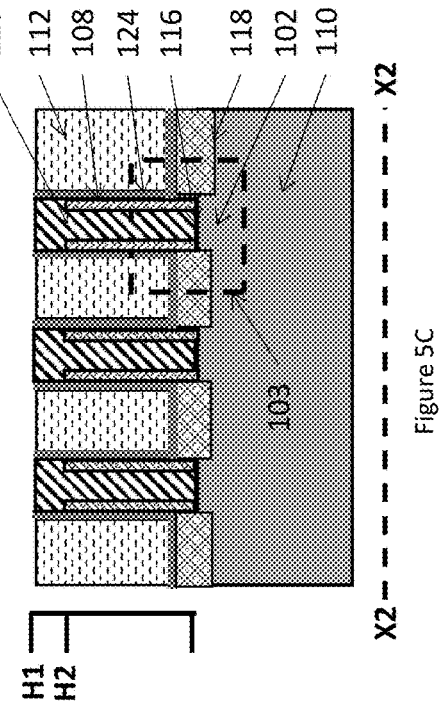
Figure 8A:
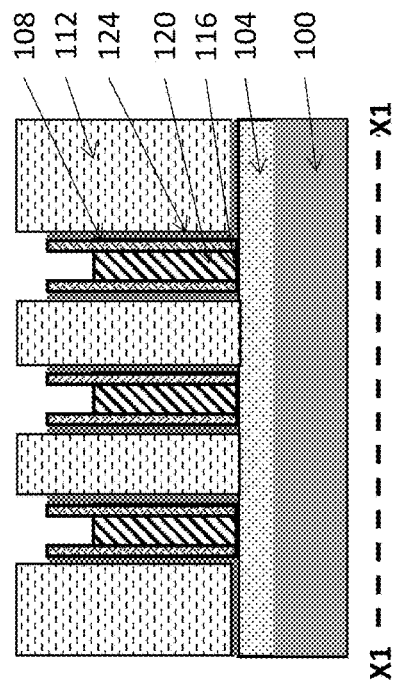
FIGS. 8A-8D are conceptual schematic diagrams of manufacturing stages of integrated circuit structures corresponding the views shown in FIG. 1A-1D, respectively.
Figure 8B:
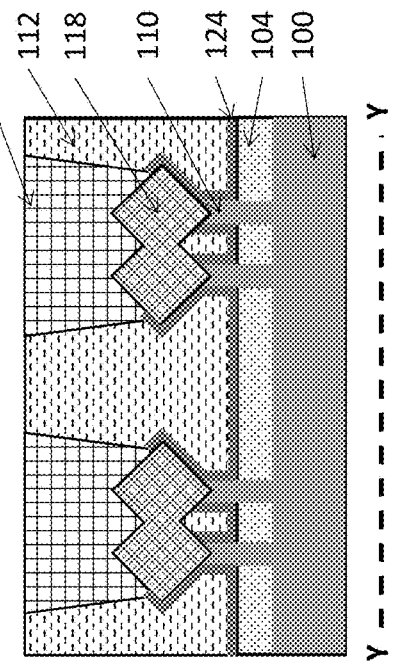
Figure 8C:
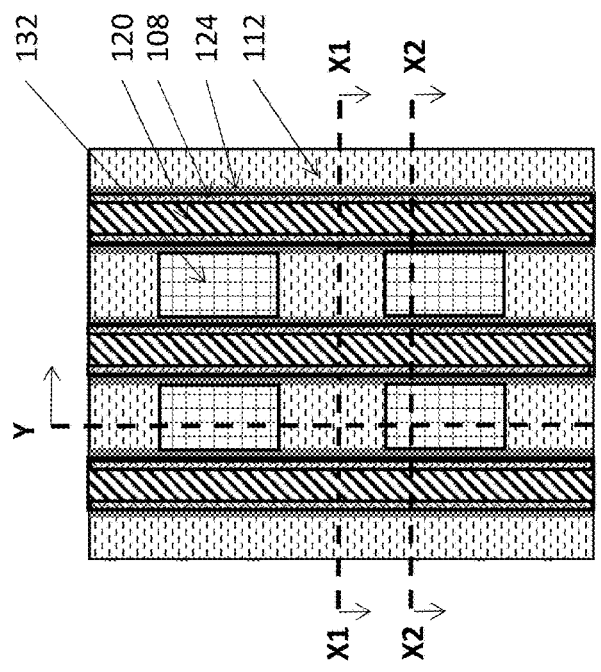
Figure 8D:
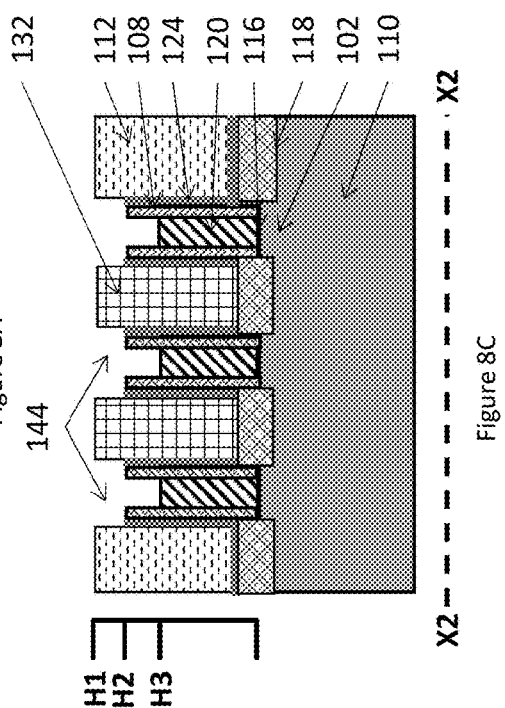

Also, FIG. 5C illustrates that this processing forms a fin-type field effect transistor (FinFET) 103 that includes a channel region 102, source/drain regions 118 on the sides of the channel region 102, a gate oxide (insulator) 116, and a gate (conductor) 120. As is explained above, voltage in the lower portion 120 of the gate structures changes the conductivity of the channel 102 allowing or preventing current from flowing between the source/drains 118. With such processing multiple FinFETs 103 are formed on each fin 110 herein.

FIGS. 6A-6D show the same views as FIGS. 1A-1D mentioned above. As shown in FIGS. 6A-6D, the methods herein pattern a mask 138 and perform selective material removal (e.g., etching) to remove portions of the lower insulator layer 112 that is between the lower portion 120 of the gate structures. This processing can also be directional and remove portions of the second sidewall insulator 124 that are on horizontal surfaces (while leaving most of the second sidewall insulator 124 on the first sidewall insulator 108) but this processing is selective so as to not remove the source/drain structures 118. Note that, as shown in FIGS. 6A-6D, the thickness of the upper portion, or height, of the second sidewall insulator 124 may be slightly reduced when the portions of the lower insulator layer 112 are etched away. Additionally, this selective material removal process is performed while the lower portion 120 of gate structures (having height H1) fully covers the sides and tops of the first sidewall insulator 108 (having height H2), preventing the first sidewall insulator 108 from being removed even if a portion of the second sidewall insulator 124 is removed. Therefore, the processing shown in FIGS. 6A-6D exposes ones of the source/drain structures 118 (as permitted by the mask 138) but avoids substantially removing the first or second sidewall insulators 108, 124, or the source/drain structures 118.

FIGS. 7A-7D show the same views as FIGS. 1A-1D mentioned above. As shown in FIGS. 7A-7D, the methods herein fill the space previously occupied by the lower insulator layer with a sacrificial material 132 (such as an optical polymerization layer (OPL)) that can be later selectively removed. Thus, as shown in FIGS. 7A-7D, the methods herein form what are referred to herein as sacrificial source/drain contact structures 132 to the first height (H1) on exposed ones of the source/drain structures 118 between the lower portion 120 of the gate structures (potentially after CMP or similar processing).

FIGS. 8A-8D show the same views as FIGS. 1A-1D mentioned above. As shown in FIGS. 8A-8D, the methods herein reduce the height of the lower portion 120 of the gate structures to a third height (H3) from the fin 110 that is less than the reduced height (H2) to form first recesses 144. This recessing process is performed using reactants that only attack the material of the lower portion 120 of gate structures (first conductor) and second sidewall insulators 124 without attacking the material of first sidewall insulators 108, and without attacking the material of the sacrificial source/drain contact structures 132.

FIGS. 9A-9D show the same views as FIGS. 1A-1D mentioned above. As shown in FIGS. 9A-9D, the methods herein additionally form upper sidewall spacers 134 (e.g., a nitride, such as silicon nitride) in the first recesses 144. Sidewall spacer formation is discussed above, and with such processing the upper sidewall spacers 134 contact sidewalls of the sacrificial source/drain contact structures 132, the lower portion 120 of the gate structures, the first sidewall insulator 108, and the second sidewall insulator 124. As shown in FIGS. 9A-9D, the upper sidewall spacers 134 are etched back in the sidewall spacer formation process to only partially fill the first recess 144, and the upper sidewall spacers 134 extend between the third height (H3) and the second height (H2) so as to fill the first recesses. The upper sidewall spacers 134 can be a different insulator material from the first and second sidewall insulators 108, 124.

FIGS. 10A-10D show the same views as FIGS. 1A-1D mentioned above. As shown in FIGS. 10A-10D, the methods herein remove the sacrificial source/drain contact structures 132 to leave second recesses 146. Again, such selective material removal processing uses reactants that only attack the material of the sacrificial source/drain contact structures 132 (e.g., such as an OPL ash).

FIGS. 11A-11D show the same views as FIGS. 1A-1D mentioned above. As shown in FIGS. 11A-11D, the methods herein deposit one or more layers of conformal conductor to form a second conductor in the first recesses 144, and simultaneously in the second recesses 146 between the upper sidewall spacers 134. Excessive conductor can be removed (e.g., CMP, etc.). The second conductor can also be formed of multiple conductor layers having different work functions or the second conductor can be a single conductive material (e.g., tungsten). This processing simultaneously forms an upper portion 142 of the gate structures and lower source/drain contacts 140. Note that this processing does not need to chamfer the lower portion 120 of the gate structures before forming the upper portion 142 of the gate structures, thereby avoiding conventional chamfering steps that slow current manufacturing processes.

Figure 11A:
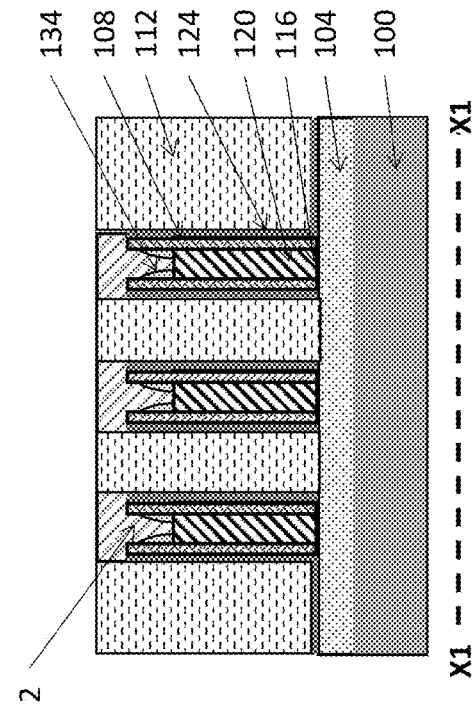
FIGS. 11A-11D are conceptual schematic diagrams of manufacturing stages of integrated circuit structures corresponding the views shown in FIG. 1A-1D, respectively.
Figure 11B:
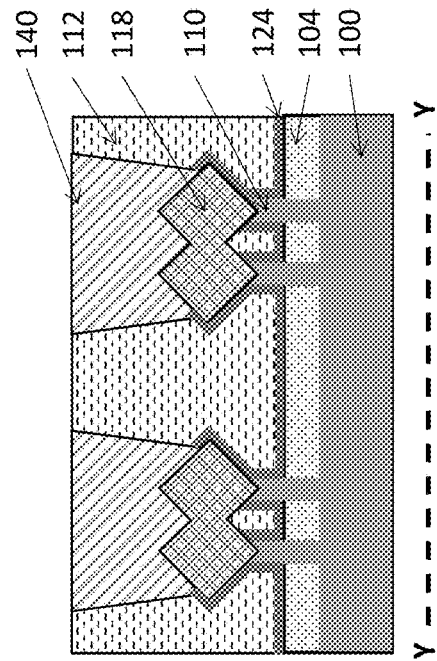
Figure 11C:
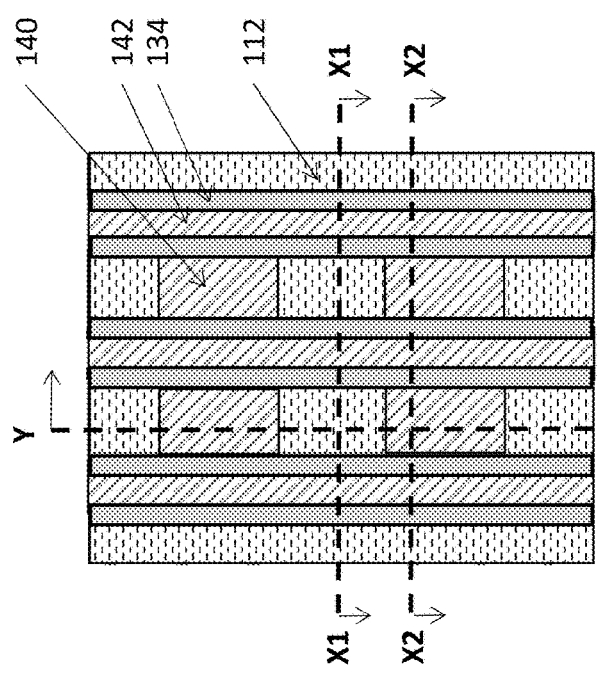
Figure 11D:
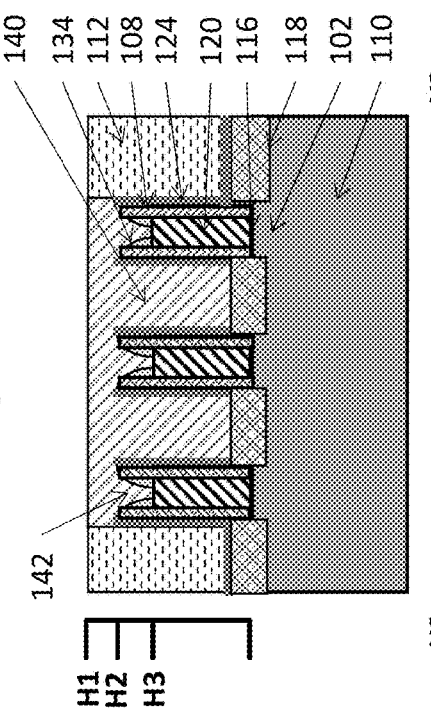

In FIGS. 12A-12D an interlayer dielectric (ILD) 150 is deposited or grown, and via openings are patterned through the ILD 150. Such via openings are subsequently filled with conductors to create via contacts, including source/drain via contacts 152 (FIGS. 11A and 11B) and gate via contacts 154 (FIGS. 11A and 11C). Note that this processing avoids conventional metal recessing, gate cap deposition, and gate cap CMP processing, and that by not performing these steps this processing is more efficient and less error prone than conventional processes.

Figure 12A:
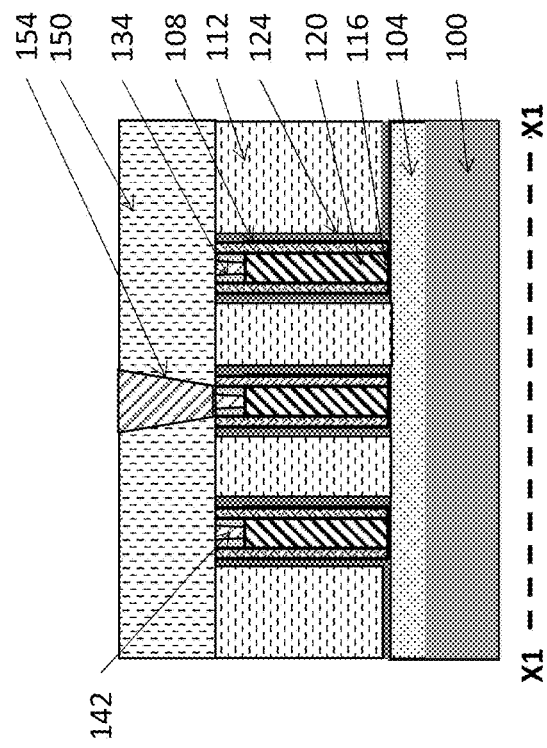
FIGS. 12A-12D are conceptual schematic diagrams of manufacturing stages of integrated circuit structures corresponding the views shown in FIG. 1A-1D, respectively.
Figure 12B:
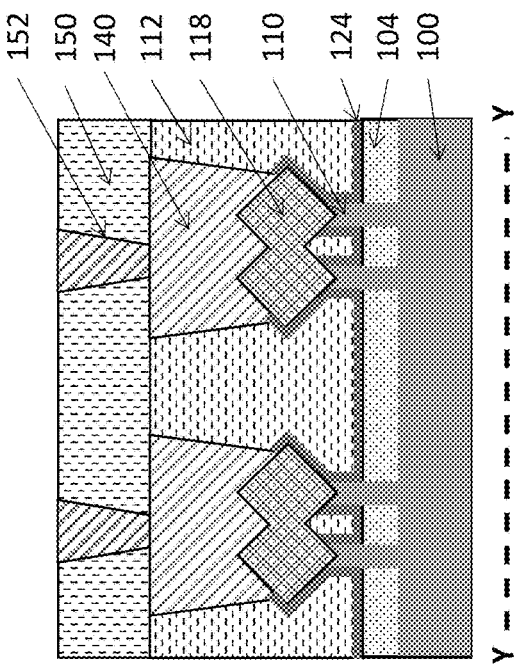
Figure 12C:
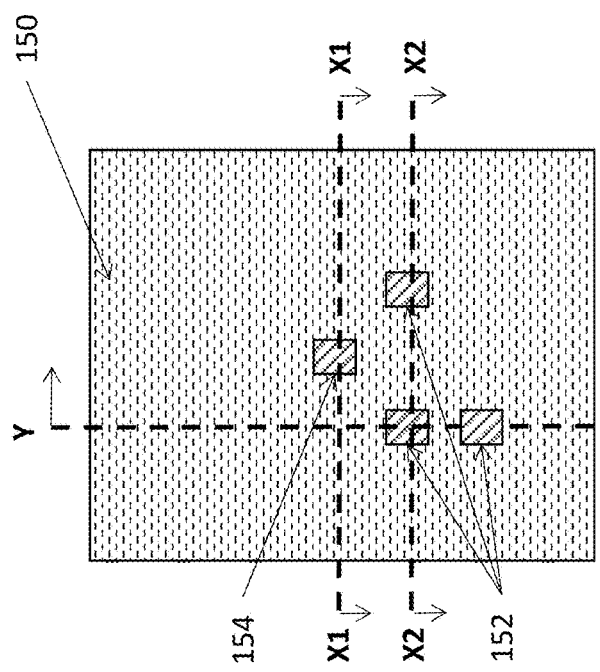
Figure 12D:
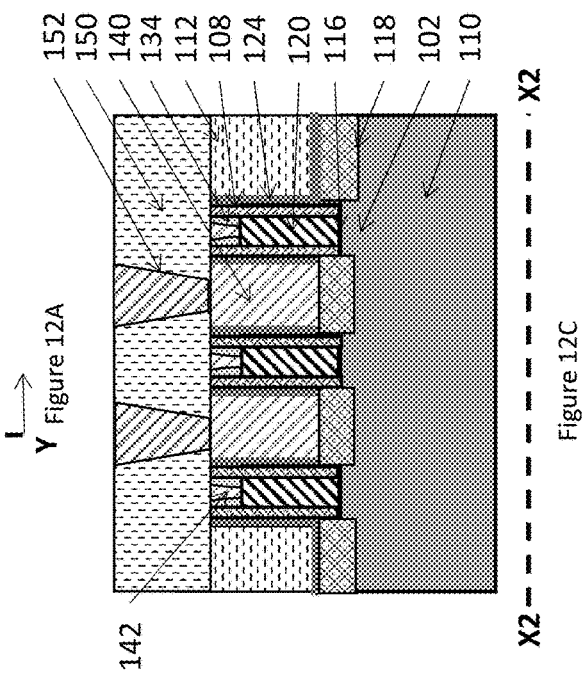
Figure 13:
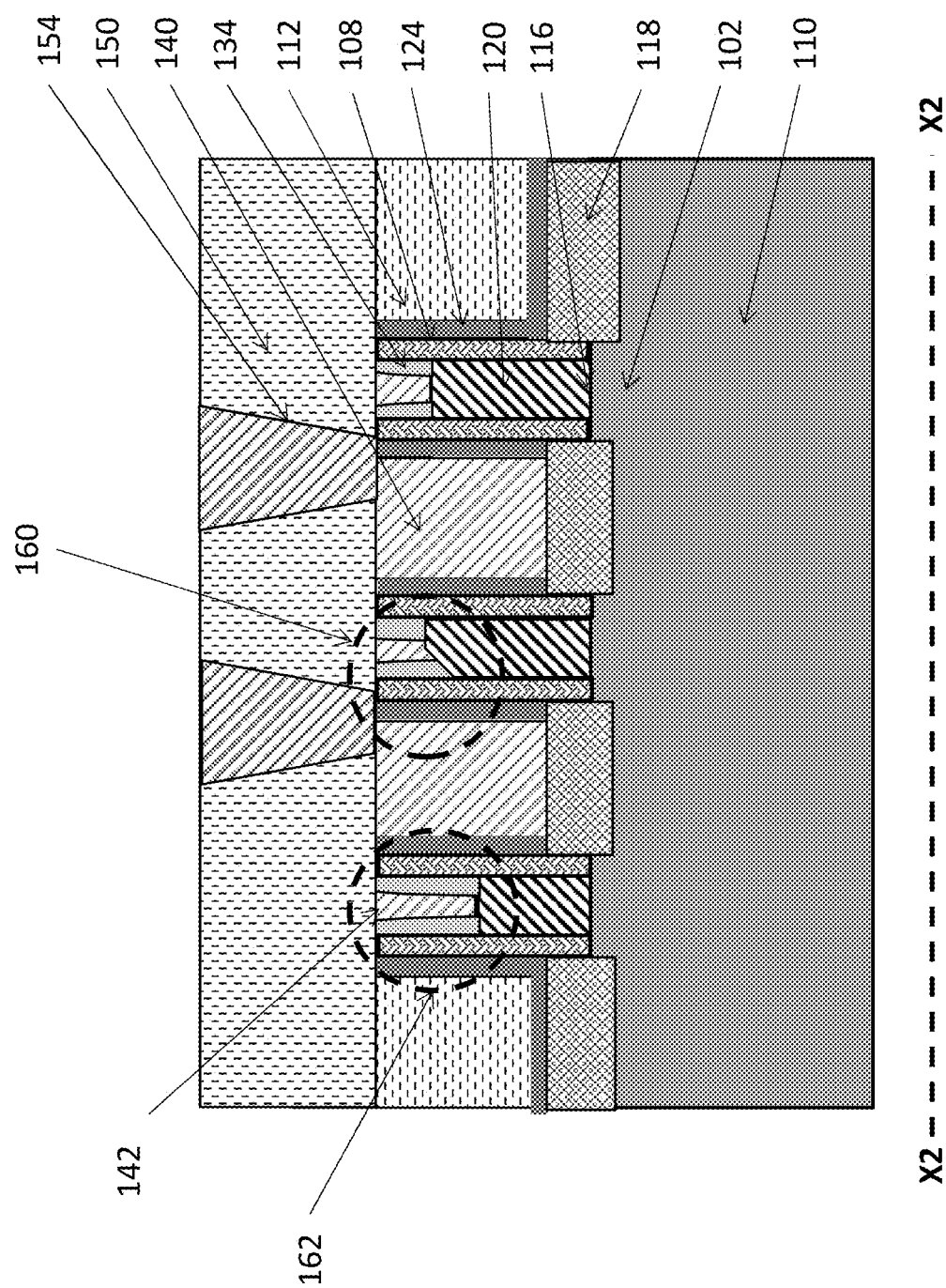
FIG. 13 is a conceptual schematic diagram of a manufacturing stages of integrated circuit structures corresponding the views shown in FIG. 12B.

FIG. 13 is a similar view to that shown in FIG. 12C along cross-section X2-X2 in FIG. 12A. FIG. 13 illustrates that the foregoing processing still allows properly sized gates to be formed, even if the height (from the fin 110) of the lower portion 120 of the gate is inconsistent where a relatively longer upper portion 142 accommodates for any height variation as shown in area 162 of FIG. 13. In other words, even if the first recesses 144 have irregular depths/sizes because of inconsistent heights of the lower portion 120 of the gate structures, the conformal formation of the upper portion 142 of the gate structures accommodates for all such irregularities. Additionally, area 160 in FIG. 13 demonstrates that even with some misalignment between the lower source/drain contact 140 and the upper source/drain contact 152 a short (undesirable electrical connection) is not formed between the upper source/drain contact 152 and the gate structure 120, 142 because of the additional space and insulation provided by the upper sidewall spacer 134 and the first and second sidewall insulators 108, 124.

Therefore, FIGS. 12A-13 demonstrate that such processing produces exemplary structures that include (among other components) parallel fins 110 extending from a lower layer 100 that are patterned in a first direction, and parallel gate structures 120, 142 intersecting the fins 110 in a second direction perpendicular to the first direction. Here, both the first and second directions are parallel to the top surface of the fin 110 (e.g., see FIG. 1A). The gate structures have a lower portion 120 that includes a first conductor adjacent to the fins 110, and an upper portion 142 (contacting the lower portion 120) that includes a second conductor distal to the fins 110.

The lower portion 120 of the gate structures can have irregular heights from the fin, as shown in FIG. 13. Also, the lower portion 120 of gate structures is wider, in the first direction, than the upper portion 142 of the gate structures because the upper sidewall spacers 134 narrow the first recess 144 (e.g., see FIG. 10C) making the upper portion 142 of the gate structures relatively narrower. The lower portion 120 of gate structures (first conductor) and the upper portion 142 of the gate structures (second conductor) can be different from one another, and each can be made up of many different material layers, such as multiple conductor layers with different work functions. In some implementations the lower portion 120 of the gate structures includes work function metals (WFM) while the upper portion 142 of the gate structures are a single conductor (e.g., tungsten, etc.).

Additionally, a gate insulator 116 is between (contacts) the lower portion 120 of the gate structures and the fins 110, and epitaxial source/drain structures 118 are positioned on (contact) the fins 110 between the gate structures 120, 142. Further, lower source/drain contacts 140 are on (contact) the source/drain structures 118. Such lower source/drain contacts 140 are also positioned between the gate structures 120, 142.

Multiple sidewall insulator layers 108, 124 are positioned between the gate structures 120, 142 and the lower source/drain contacts 140, adjacent to the upper portion 142 and the lower portion 120 of the gate structures. The multiple insulator layers 108, 124 contact one another and can be made of different insulator layers having different dielectric constants. Additional upper sidewall spacers 134 are positioned to contact and be between the upper portion 142 of the gate structures and the multiple insulator layers 108, 124. The upper sidewall spacers 134 are only adjacent to the upper portion 142 of the gate structures and are not adjacent to the lower portion 120 of the gate structures. The upper sidewall spacers 134 can be a different insulator material from the multiple insulator layers 108, 124.

Also, an inter-layer dielectric is positioned on (contacts) the lower source/drain contacts 140 and the upper portion 142 of the gate structures 120, 142. Gate contacts 154 extend through the inter-layer dielectric and contact the upper portion 142 of the gate structures. Further, upper source/drain contacts 152 extend through the inter-layer dielectric and contact the lower source/drain contacts 140. The upper portion 142 of the gate structures and the lower source/drain contacts 140 can be the same material.

Figure 14:
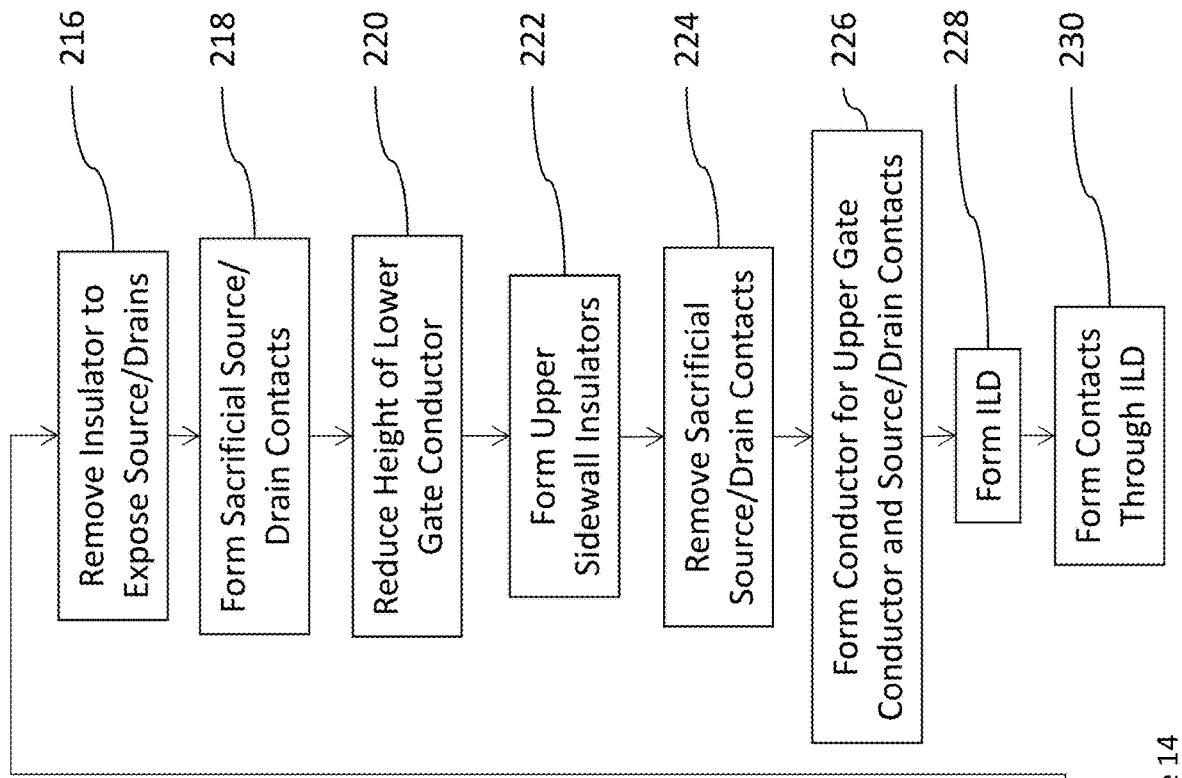
FIG. 14 is a flow diagram illustrating embodiments herein.

As shown in flowchart form in FIG. 14, exemplary methods herein pattern a layer to form parallel fins extending from the layer, where the fins are patterned in a first direction/orientation in item 202. Further, in item 204 such methods pattern parallel sacrificial gates intersecting the fins in a second direction perpendicular to the first direction. In item 206, these methods form a first sidewall insulator on sidewalls of the sacrificial gates. The methods herein epitaxially grow source/drain structures on the fins between the sacrificial gates in item 208. In item 210, these methods form a second sidewall insulator on the first sidewall insulator, and form a lower insulator layer on the second sidewall insulator between the sacrificial gate.

As shown in item 212, such methods reduce a height of the sacrificial gates and the first sidewall insulator from a first height from the fin to a reduced height from the fin, in processing that leaves the lower insulator layer and the second sidewall insulator at the first height. Also, as shown in item 214, these methods replace the sacrificial gates with a first conductor to form a lower portion of gate structures, in processing that forms the lower portion of gate structures to the first height and to cover the sides and tops of the first sidewall insulator.

Additionally, as shown in item 216, these methods remove portions of the lower insulator layer and corresponding horizontal portions of the second sidewall insulator while the lower portion of gate structures covers the first sidewall insulator. This processing in item 216 exposes ones of the source/drain structures, but avoids removing the second sidewall insulators from the first sidewall insulator or the lower portion of the gate structures. In item 218, such methods form sacrificial source/drain contact structures to the first height on exposed ones of the source/drain structures between the lower portion of the gate structures. In item 220, these methods reduce the height of the lower portion of the gate structures (to a third height from the fin) to less than the reduced height, to form first recesses.

In item 222, these methods also form upper sidewall spacers in the first recesses on sidewalls of the sacrificial source/drain contact structures, the lower portion of the gate structures, the first sidewall insulator, and the second sidewall insulator. The upper sidewall spacers partially fill the first recess, and the upper sidewall spacers extend the depth of the first recesses.

Methods herein remove the sacrificial source/drain contact structures to leave second recesses in item 224 (but avoid any chamfering of the lower portion of the gate structures, as noted above). In item 226, such methods form a second conductor in the first recesses between the upper sidewall spacers and in the second recesses to form an upper portion of the gate structures and source/drain contact structures (while avoiding SAC cap formation and CMP, as noted above). The upper sidewall spacers can be a different insulator material from the first sidewall insulator and the second sidewall insulator, and the first sidewall insulator and the second sidewall insulator have different dielectric constants.

Also, as shown in item 228, an inter-layer dielectric is positioned on (contacts) the lower source/drain contacts, the upper portion of the gate structures, and on the lower insulator. Contacts are formed through the ILD in item 230 where gate contacts extend through the inter-layer dielectric and contact the upper portion of the gate structures. Further, upper source/drain contacts are formed in item 230 to extend through the inter-layer dielectric and contact the lower source/drain contacts. Again, the upper portion of the gate structures and the lower source/drain contacts can be the same material.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An integrated circuit apparatus comprising:
parallel fins extending from a layer, wherein the fins are patterned in a first direction;
parallel gate structures intersecting the fins in a second direction perpendicular to the first direction, wherein the gate structures have a lower portion comprising a first conductor adjacent to the fins and an upper portion comprising a second conductor distal to the fins, and wherein the first conductor and the second conductor are different materials;
source/drain structures positioned on the fins between the gate structures;
source/drain contacts positioned on the source/drain structures;
multiple insulator layers positioned between the gate structures and the source/drain contacts; and
upper sidewall spacers positioned between the upper portion of the gate structures and the multiple insulator layers.

2. The integrated circuit apparatus according to claim 1, wherein the upper sidewall spacers are only adjacent to the upper portion of the gate structures and are not adjacent to the lower portion of the gate structures.

3. The integrated circuit apparatus according to claim 1, wherein the multiple insulator layers are adjacent to the upper portion and the lower portion of the gate structures.

4. The integrated circuit apparatus according to claim 1, wherein the lower portion of gate structures is wider, in the first direction, than the upper portion of the gate structures.

5. The integrated circuit apparatus according to claim 1, wherein the upper sidewall spacers are a different insulator material from the multiple insulator layers.

6. The integrated circuit apparatus according to claim 1, wherein the multiple insulator layers comprise two different insulator layers having different dielectric constants.

7. The integrated circuit apparatus according to claim 1, wherein the source/drain contacts and the upper portions of the gate structures are the same material.

8. An integrated circuit apparatus comprising:
parallel fins extending from a layer, wherein the fins are patterned in a first direction;
parallel gate structures intersecting the fins in a second direction perpendicular to the first direction, wherein the gate structures have a lower portion comprising a first conductor adjacent to the fins and an upper portion comprising a second conductor distal to the fins, and wherein the first conductor and the second conductor are different materials;
a gate insulator between the lower portion of the gate structures and the fins;
epitaxial source/drain structures positioned on the fins between the gate structures;
lower source/drain contacts positioned on the source/drain structures;
multiple insulator layers positioned between the gate structures and the lower source/drain contacts;
upper sidewall spacers positioned between the upper portion of the gate structures and the multiple insulator layers;
an inter-layer dielectric positioned on the lower source/drain contacts and the upper portion of the gate structures;
gate contacts extending through the inter-layer dielectric and contacting the upper portion of the gate structures; and
upper source/drain contacts extending through the inter-layer dielectric and contacting the lower source/drain contacts.

9. The integrated circuit apparatus according to claim 8, wherein the upper sidewall spacers are only adjacent to the upper portion of the gate structures and are not adjacent to the lower portion of the gate structures.

10. The integrated circuit apparatus according to claim 8, wherein the multiple insulator layers are adjacent to the upper portion and the lower portion of the gate structures.

11. The integrated circuit apparatus according to claim 8, wherein the lower portion of gate structures is wider, in the first direction, than the upper portion of the gate structures.

12. The integrated circuit apparatus according to claim 8, wherein the upper sidewall spacers are a different insulator material from the multiple insulator layers.

13. The integrated circuit apparatus according to claim 8, wherein the multiple insulator layers comprise two different insulator layers having different dielectric constants.

14. The integrated circuit apparatus according to claim 8, wherein the gate structures have irregular heights from the fins.

15. An integrated circuit apparatus comprising:
parallel gate structures intersecting fins, wherein the gate structures have a lower portion comprising a first conductor adjacent to the fins and an upper portion comprising a second conductor distal to the fins, and wherein the first conductor and the second conductor are different materials;
source/drain structures positioned on the fins between the gate structures;
source/drain contacts positioned on the source/drain structures;
at least one insulator layer positioned between the gate structures and the source/drain contacts; and
upper sidewall spacers positioned between the upper portion of the gate structures and the insulator layer.

16. The integrated circuit apparatus according to claim 15, wherein the upper sidewall spacers are only adjacent to the upper portion of the gate structures and are not adjacent to the lower portion of the gate structures.

17. The integrated circuit apparatus according to claim 15, wherein the insulator layer is adjacent to the upper portion and the lower portion of the gate structures.

18. The integrated circuit apparatus according to claim 15, wherein the lower portion of gate structures is wider than the upper portion of the gate structures.

19. The integrated circuit apparatus according to claim 15, wherein the upper sidewall spacers are a different insulator material from the insulator layer.

20. The integrated circuit apparatus according to claim 15, wherein the insulator layer comprises two different insulator layers having different dielectric constants.

* * * * *